US011301415B2

(12) United States Patent
Custodio

(10) Patent No.: US 11,301,415 B2
(45) Date of Patent: Apr. 12, 2022

(54) INTERFACE DISCOVERY BETWEEN PARTITIONS OF A PROGRAMMABLE LOGIC DEVICE

(71) Applicant: Intel Corporation, Santa Clara, CA (US)

(72) Inventor: Evan Custodio, Seekonk, MA (US)

(73) Assignee: Intel Corporation, Santa Clara, CA (US)

( * ) Notice: Subject to any disclaimer, the term of this patent is extended or adjusted under 35 U.S.C. 154(b) by 827 days.

(21) Appl. No.: 15/862,249

(22) Filed: Jan. 4, 2018

(65) Prior Publication Data

US 2019/0042533 A1 Feb. 7, 2019

(51) Int. Cl.

| | |
|---|---|
| ***H03K 19/17756*** | (2020.01) |
| ***G06F 15/78*** | (2006.01) |
| *H03K 19/0175* | (2006.01) |
| *H03K 19/17736* | (2020.01) |
| *G06F 30/34* | (2020.01) |

(52) U.S. Cl.

CPC ... *G06F 15/7867* (2013.01); *H03K 19/17756* (2013.01); *G06F 30/34* (2020.01); *H03K 19/017581* (2013.01); *H03K 19/17744* (2013.01)

(58) Field of Classification Search

CPC ................ G06F 15/7867; G06F 30/34; H03K 19/17756; H03K 19/017581; H03K 19/17744

See application file for complete search history.

(56) References Cited

U.S. PATENT DOCUMENTS 9,537,488 B1 * 1/2017 Atsatt .............. H03K 19/17748
2014/0145758 A1 * 5/2014 Atsatt ........... H03K 19/017581

* cited by examiner

*Primary Examiner* — Seokjin Kim
(74) *Attorney, Agent, or Firm* — Fletcher Yoder P.C.

(57) ABSTRACT

Systems, methods, and devices for enhancing the flexibility of an integrated circuit device with partially reconfigurable regions are provided. For example, a discovery interface may determine and/or communicate a suitable logical protocol interface to control data transfer between regions on the integrated circuit device. The techniques provided herein result in more flexible partial reconfiguration options to enable greater compatibility between accelerator hosts and accelerator function units.

20 Claims, 14 Drawing Sheets

PROCESSOR
200
206
202
204
DISCOVERY INTERFACE SOFTWARE
①
PARTIAL RECONFIG SOFTWARE
②
PARTIAL BITSTREAM MEMORY STORAGE
40
FPGA
72
STATIC REGION
208
STATIC REGION LOGIC
PR
82
60
90
DISC
LOGICAL PROTOCOL A1 OR B1
70
62
PARTIAL RECONFIGURATION IN PROCESS
PARTIAL REGION

INTERFACE DISCOVERY BETWEEN PARTITIONS OF A PROGRAMMABLE LOGIC DEVICE

BACKGROUND

The present disclosure relates generally to integrated circuits, such as field-programmable gate arrays (FPGAs). More particularly, the present disclosure relates to logical interface discovery between regions of an integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Modern electronics such as computers, portable devices, network routers, data centers, Internet-connected appliances, and more, tend to include at least one integrated circuit device. Integrated circuit devices take a variety of forms, including processors, memory devices, and programmable devices, to name only a few examples. An FPGA is one type of programmable device utilizing integrated circuits. Programmable devices may include logic that may be programmed (e.g., configured) after manufacturing to provide a wide variety of functionality based on various designs possible within the programmable devices. Thus, programmable devices contain programmable logic (e.g., logic blocks) that may be configured and reconfigured to perform a variety of functions on the devices, according to a configured design. Further, some programmable devices may include adaptable logic that enables partial reconfiguration, such that a portion of the functionality of the IC may be modified (e.g., enabling functionality to be added, removed, and/or swapped) during the runtime of the programmable device. When a region of the programmable device is reconfigured in this way, that region may be referred to as a "partial reconfiguration region." A region that is not partially reconfigured when the partial reconfiguration region is reconfigured may be referred to as a "static region." In other words, a partial reconfiguration region of the programmable device can be partially reconfigured to provide new functionality while a static region of the programmable device is not reconfigured. Further, while the partial reconfiguration region is partially reconfigured, the static region may continue to perform active functions, or operate without interruption.

In some cases, a static region of a programmable device may be a component of and/or used as a host region (e.g., accelerator host region) to a partial reconfiguration region, which may be used as an accelerator (e.g., accelerator function unit (AFU)). That is, because a partial reconfiguration region is a region that is partially reconfigured in a particular circuit design, it may be used to unload, and therefore accelerate, functions that may run independently from a static, host region. Further, the static region and the partial reconfiguration region may each contain an interface to facilitate communication between the two regions. A static region and a partial reconfiguration region supporting the same interface may successfully communicate, while a static region and a partial reconfiguration region with different interfaces may be incompatible. Because there are numerous interface options for both static regions and partial reconfiguration regions, designing a circuit having a static region and a partial reconfiguration region may involve careful advance planning to ensure that the static region and the partial reconfiguration region have compatible interfaces.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
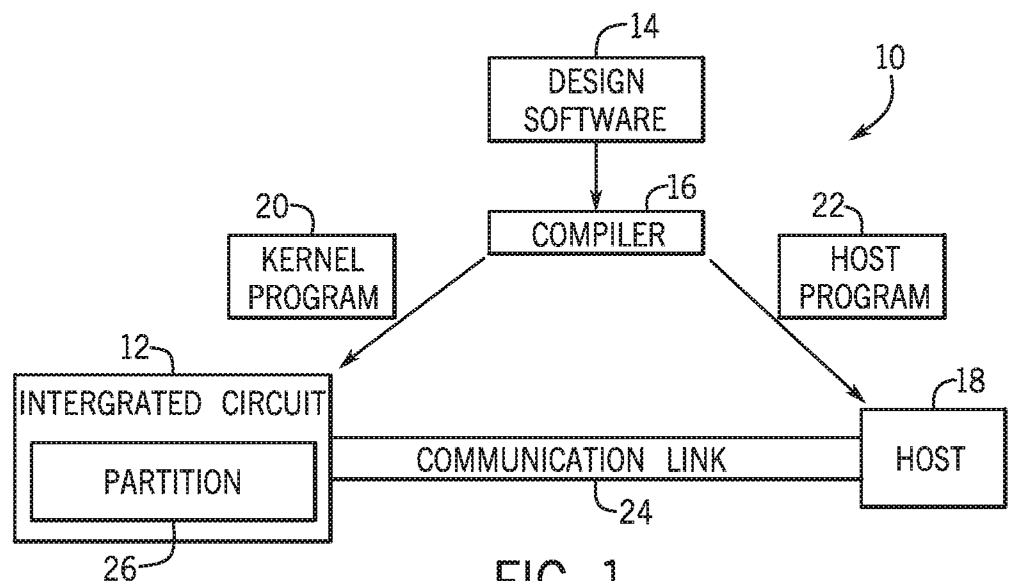
FIG. 1 is a block diagram of a system for implementing partial reconfiguration, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, to facilitate partial reconfiguration, a programmable device (e.g., an FPGA) may contain different regions, or partitions. For example, an FPGA may contain a combination of static regions and partial reconfiguration regions, where the functionality of a partial reconfiguration region may be modified (e.g., partially reconfigured) during the runtime of the FPGA and the functionality of a static region may be fixed during the runtime of the FPGA. Because its functionality is fixed, at least in comparison to the partial reconfiguration region, the static region of an FPGA may function as and/or be a component to a host for an accelerator, or AFU. The accelerator may include the partial reconfiguration region, and as such, the static region (e.g., host) may offload, and therefore accelerate, certain functions of the FPGA onto the partial reconfiguration region such that they occur separately from the static region.

Before continuing, it is noted that although this disclosure generally refers to a "static region" and a "partial reconfiguration region," these terms are meant to describe a relationship between the use of these regions and may change as different configurations are programmed onto a programmable logic device. Indeed, a "static region" may represent any region that does not change when another region (a "partial reconfiguration region") is reconfigured. For example, a first region may be a static region that may maintain the same configuration while a second region may be a partial reconfiguration region that is reconfigured many different times. In other cases, at a first time, a first region may be a static region while a second region is a partial reconfiguration region that is reconfigured, but at a second time, the second region may be a static region that maintains its same configuration while the first region may be a partial reconfiguration region that is reconfigured. In other words, whether a region is a static region or a partial reconfiguration region may vary depending on whether the region maintains a configuration while another region is reconfigured.

Further, while the FPGA may separate functionality to different regions (e.g., static regions and partial reconfiguration regions), the regions may still communicate with one another. Thus, an interface may facilitate communication between regions on the FPGA. The interface may include a physical wire interface that may restrict the use of certain wires to input or output data transfer functions (e.g., 40 input wires, 30 output wires), and the interface may further include a logical protocol interface that may provide communication standards used to transfer data (e.g., Avalon Memory Mapped Interface (Avalon-MM), Avalon Streaming Interface (Avalon-ST), Advanced Extensible Interface (AXI), and Core Cache Interface (CCI-P)). As such, regions with compatible interfaces (i.e., compatible physical wire interfaces and compatible logical protocol interfaces) may successfully communicate to one another. However, while the physical wire interface of a region may be kept static (i.e., fixed) in both the static regions and partial reconfiguration regions, the logical protocol interface may vary (e.g., once partial reconfiguration of the partial reconfiguration region occurs). Thus, regions capable of supporting more than one logical protocol interface on the same compile coupled with discovery of compatible logical protocol interfaces between regions may have increased flexibility and forward/backward compatibility with another region. That is, by utilizing regions with greater options for a compatible logical protocol interface and by determining a suitable logical protocol interface between regions, if one exists, a first region of an FPGA may have more opportunities to interface with a second region of the FPGA. As such, a host (i.e., static region) may have greater compatibility with an accelerator (i.e., partial reconfiguration region).

With the foregoing in mind, FIG. 1 illustrates a block diagram of a system 10 that utilizes partial reconfiguration to affect a machine-implemented program. A designer may desire to implement functionality on an integrated circuit 12 (IC, such as an FPGA). The designer may specify a program to be implemented, which may enable the designer to provide programming instructions to implement a set of programmable logic for the IC 12. Further, the designer may partially reconfigure a partially reconfigurable region on the IC 12.

The designer may implement a design using design software 14, such as a version of Quartus by Intel Corporation. The design software 14 may use a compiler 16 to convert the program into a low level program. The compiler 16 may provide machine-readable instructions representative of the program to a host 18 and the IC 12. For example, the IC 12 may receive one or more kernel programs 20 which describe the hardware implementations that should be stored in the IC. The host 18 may receive a host program 22 which may be implemented by the kernel programs 20. To implement the host program 22, the host 18 may communicate instructions from the host program 22 to the IC 12 via a communications link 24, which may be, for example, direct memory access (DMA) communications or peripheral component interconnect express (PCIe) communications. In some embodiments, the kernel programs 20 and the host 18 may enable configuration and/or partial reconfiguration of a partition 26 on the IC 12. The partition 26 may be a region on the IC 12 with adaptable logic such that configuration and/or partial reconfiguration may enable functionality to be added, removed, and/or swapped before and/or during the runtime of the IC 12.

Figure 2:
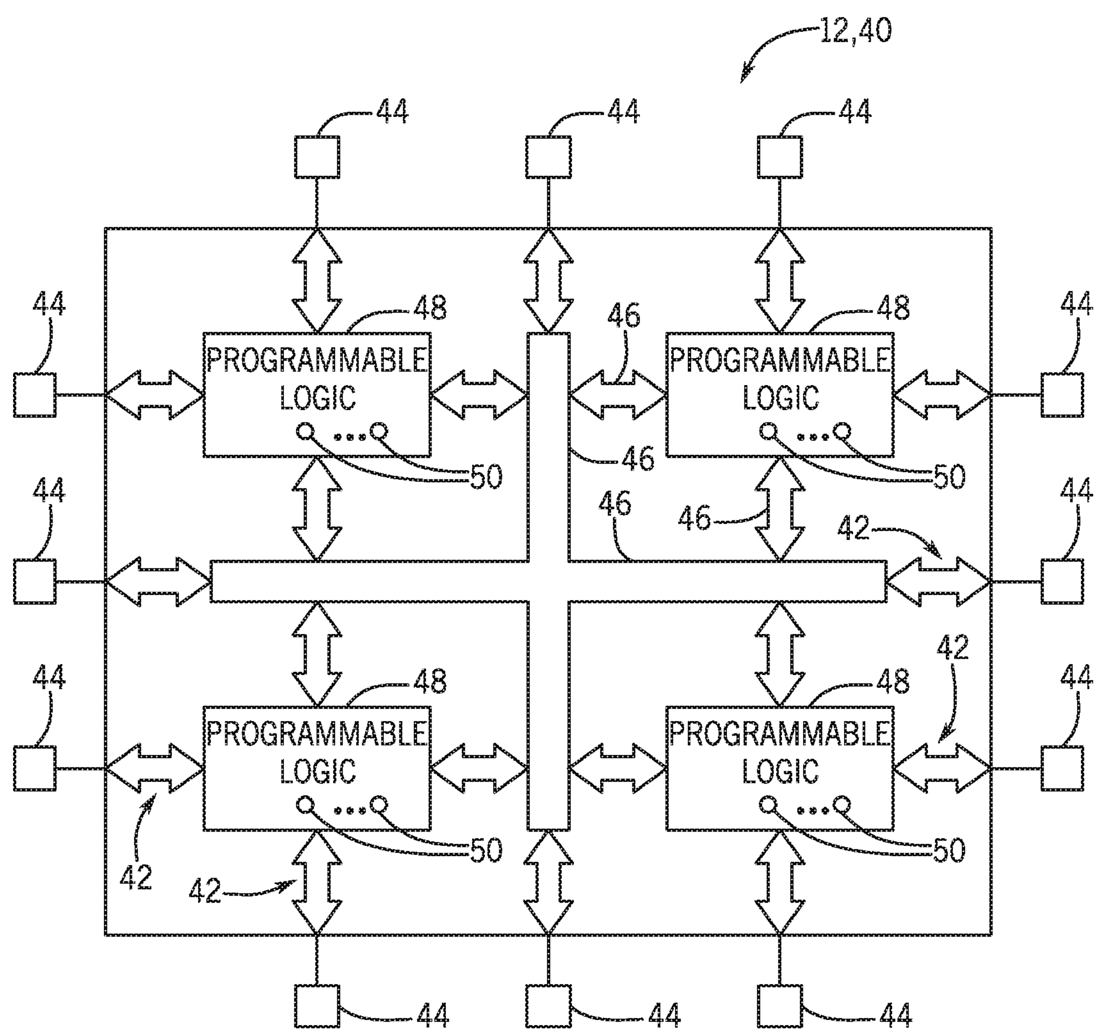
FIG. 2 is a block diagram of an integrated circuit where partial reconfiguration may be implemented, in accordance with an embodiment.

Turning now to a more detailed discussion of the IC 12, FIG. 2 illustrates an IC 12, which may be a programmable logic device, such as a field-programmable gate array (FPGA) 40. For the purposes of this example, the device is referred to as an FPGA 40, though it should be understood that the device may be any type of programmable logic device (e.g., an application-specific integrated circuit and/or application-specific standard product). As shown, FPGA 40 may have input/output circuitry 42 for driving signals off FPGA 40 and for receiving signals from other devices via input/output pins 44. Interconnection resources 46, such as global and local vertical and horizontal conductive lines and buses, may be used to route signals on FPGA 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as FPGA 40, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Most programmable logic devices are electrically programmed. With electrical programming arrangements, the programmable elements 50 may be formed from one or more memory cells. For example, during programming, configuration data is loaded into the memory cells 50 using input/output pins 44 and input/output circuitry 42. In one embodiment, the memory cells 50 may be implemented as random-access-memory (RAM) cells. The use of memory cells 50 based on RAM technology is described herein is intended to be only one example. Further, because these RAM cells are loaded with configuration data during programming, they are sometimes referred to as configuration RAM cells (CRAM). These memory cells 50 may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of FPGA 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, other device arrangements may use logic that is not arranged in a manner other than rows and columns.

Figure 3:
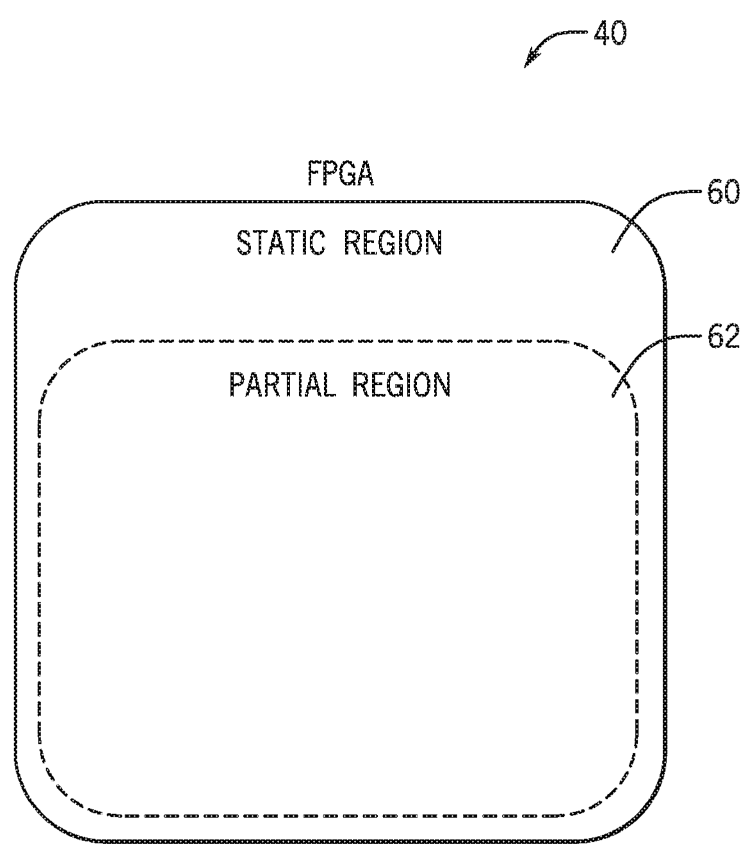
FIG. 3 is a block diagram of an integrated circuit with a static region and a partial reconfiguration region suitable for partial reconfiguration, in accordance with an embodiment.

In some instances, it may be desirable to partially reconfigure certain portions (i.e., partitions 26) of the FPGA 40. That is, the FPGA 40 may include adaptable logic that enables partial reconfiguration, such that a portion of the functionality of the FPGA 40 may be modified (e.g., enabling functionality to be added, removed, and/or swapped) during its runtime. Accordingly, FIG. 3 illustrates an embodiment of the FPGA 40 that includes a static region 60 and a partial reconfiguration region 62. During partial reconfiguration of the FPGA 40, the static region 60 may remain operational, while the partial reconfiguration region 62 may be reconfigured to perform a new function. As such, the static region 60 and the partial reconfiguration region 62 may not operate simultaneously. Further, the partial reconfiguration region 62 may perform functions that may occur in a separate location on the FPGA 40 and/or during different times from other functions. That is, the partial reconfiguration region 62 may perform functions that are not handled by the static region 60. Additionally, or in the alternative, the partial reconfiguration region 62 may perform a first function before being reconfigured to perform a second function at a later time period during the FPGA's 40 runtime. As such, the static region 60 may act as a host, and the partial reconfiguration region may act as an accelerator (i.e., AFU). That is, the fixed static region 60 (i.e., host) may unload (i.e., accelerate) functionality to the partial reconfiguration region 62 (i.e., accelerator). Thus, the partial reconfiguration region 62 may be configured and/or reconfigured to perform functionalities that the static region 60 does not handle so that resources in the static region 60 may be utilized for other functionalities.

Figure 4:
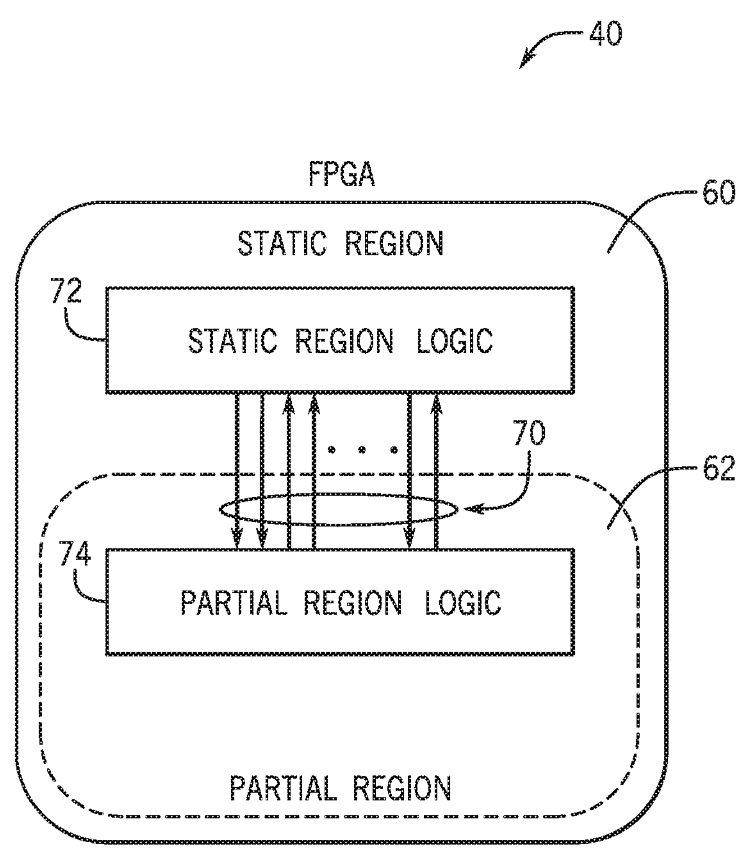
FIG. 4 is a block diagram of the integrated circuit of FIG. 3, in which the integrated circuit includes a static region coupled to a partial reconfiguration region via a physical wire interface, in accordance with an embodiment.

Further, to enable communication (i.e., data transfer) between the static region 60 and the partial reconfiguration region 62, and thereby, to enable successful partial reconfiguration of the partial reconfiguration region 62, a physical wire interface 70 may communicatively couple the static region 60 and the partial reconfiguration region 62, as FIG. 4 illustrates. The physical wire interface 70 may contain any suitable number of wires (i.e., connections) between the static region 60 and the partial reconfiguration region 62 to enable data transfer to and from each region. As such, the static region 60 and the partial reconfiguration region 62 may each contain logic (i.e., static region logic 72 and partial reconfiguration region logic 74, respectively) to send and receive data via the physical wire interface 70. In some embodiments, the static region logic 72 and the partial reconfiguration region logic 74 may include information regarding the configuration of the physical wire interface 70. That is, the static region logic 72 and the partial reconfiguration region logic 74 may each be configured, for example, to input data on a certain set of wires in the physical wire interface 70 and to output data on a separate set of wires in the physical wire interface 70. In some embodiments, for example, the static region logic 72 may specify that the physical wire interface 70 contains twenty wires to output data from the static region 60 and thirty wires to input data to the static region 60, while the partial reconfiguration region logic 74 may specify that the physical wire interface 70 of the partial reconfiguration region 62 contains twenty input wires to receive data and thirty output wires to transmit data.

Figure 5:
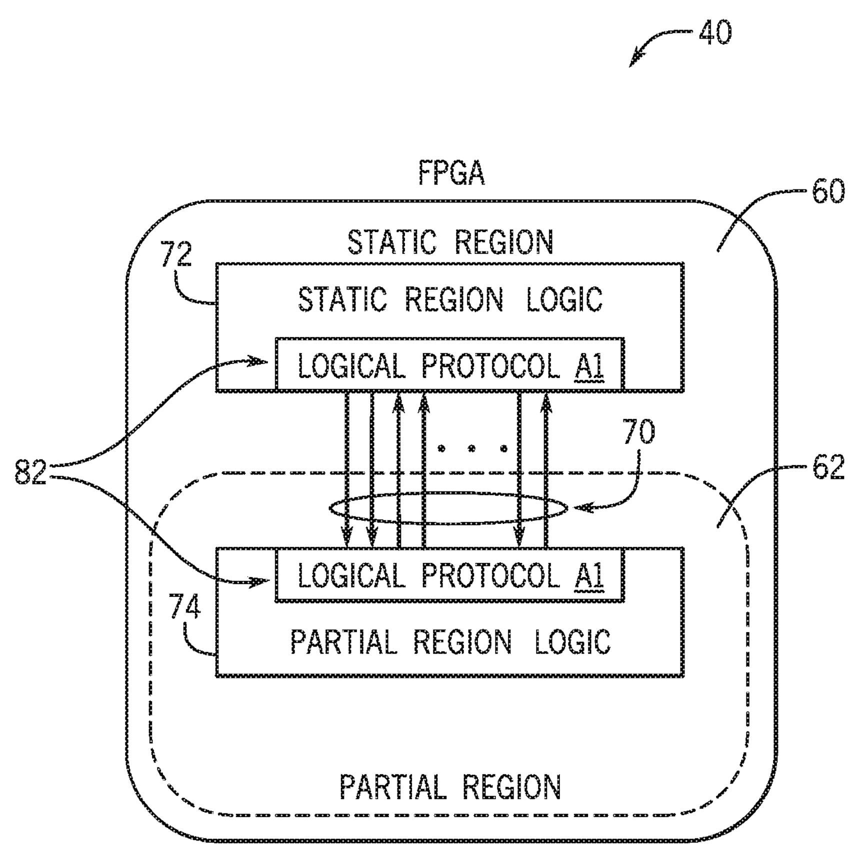
FIG. 5 is a block diagram of the integrated circuit of FIG. 4, in which the static region and the partial reconfiguration region include a logical protocol interface, in accordance with an embodiment.

While the physical wire interface 70 may provide input and output connections between the static region 60 and the partial reconfiguration region 62, a logical protocol interface 82 (i.e., logical protocol) may include guidelines for data communication, as FIG. 5 illustrates. Examples of a logical protocol interface 82 may include Avalon-MM, Avalon-ST, AXI, and CCI-P, to name a few. That is, the logical protocol interface 82 may include specifications for a communication protocol, specific wire to port mappings (i.e., via the physical wire interface 70), port widths, clock speeds, and/or the like. To that end, the logical protocol interface 82 may control the type, location, speed, and timing of data transfer, among other things. Each logical protocol interface (e.g., Avalon-MM, Avalon-ST, AXI, CCI-P) may include a different set of standards for data transfer. As such, to enable successful communication between two regions (e.g., the static region 60 and the partial reconfiguration region 62) on an FPGA 40, each region may contain compatible physical wire interfaces 70 and compatible logical protocol interfaces 82 with one another. For example, to send and/or receive data to/from one another, both the partial reconfiguration region 62 and the static region 60 may follow the guidelines of Avalon-MM as their logical protocol interface 82. In other embodiments, the partial reconfiguration region 62 and the static region 60 may both utilize CCI-P as their logical protocol interface 82. Further, in some embodiments, logical protocol interfaces 82 may support backwards compatibility. That is, a version of a logical protocol interface 82 may be compatible with an older and/or newer version of the logical protocol interface 82.

In some embodiments, however, because the FPGA 40 may support partial reconfiguration of the partial reconfiguration region 62, the logical protocol interface 82 of the partial reconfiguration region 62 may be variable. That is, partial reconfiguration of the partial reconfiguration region 62 may alter and/or change the logical protocol interface 82 supported by the partial reconfiguration region 62. Further, in some embodiments, the partial reconfiguration region 62 and/or the static region 60 may each support multiple logical protocol interfaces 82 (e.g., support both Avalon-MM and AXI) without requiring a compile. That is, a single build of the static region 60 and/or partial reconfiguration region 62 may be equipped to support more than one logical protocol interface 82. However, in some embodiments, the logical protocol interface 82 supported by one region of the FPGA 40 may not be supported by another region, making the two regions incompatible. As such, in some embodiments, the static region logic 72 and/or the partial reconfiguration region logic 74 may support an interface that may determine a suitable logical protocol 82 to use between the static region 60 and the partial reconfiguration region 63, if one exists.

Figure 6:
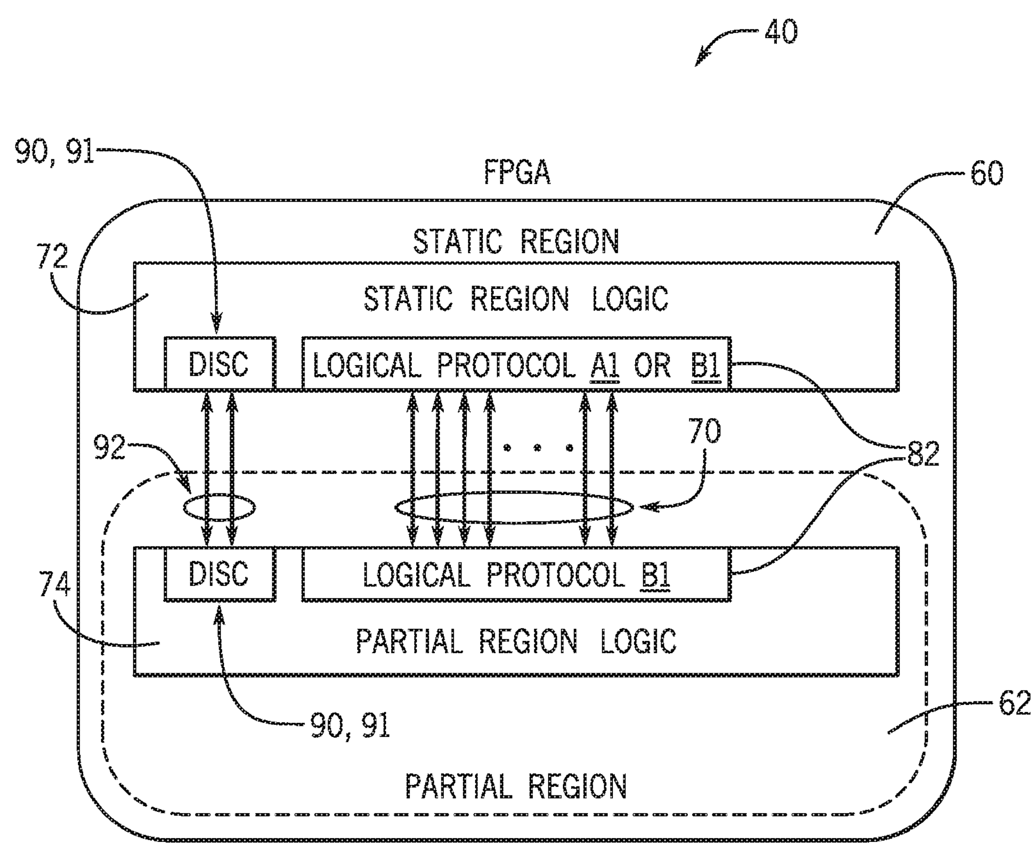
FIG. 6 is a block diagram of the integrated circuit of FIG. 5, in which the static region and the partial reconfiguration region include a discovery interface, in accordance with an embodiment.

Accordingly, FIG. 6 illustrates an FPGA 40 with a discovery interface 90. The discovery interface 90 may include a discovery logic block 91, a protocol, and discovery interface wires 92 (i.e., connections) that may be separate (i.e., out of band) from the physical wire interface 70 and its wires. As such, the discovery interface 90 may send and/or receive data separate from the information sent over the physical wire interface 70. In some embodiments, the discovery interface wires 92 may be used transmit and/or receive data to communicate and/or determine (i.e., logical interface discovery) the suitable logical protocol interface 82 to be used by the static region 60 and the partial reconfiguration region 62. For example, in the illustrated embodiment, both the static region 60 and the partial reconfiguration region 62 include the discovery interface 90 in the static region logic 72 and the partial reconfiguration region logic 74, respectively. As such, the discovery interface 90 of the static region 60 may communicate, according to a standard discovery interface protocol, that A1 and B1 (e.g., Avalon-MM and AXI) are available logical protocol interfaces 82, while the discovery interface 90 of the partial reconfiguration region 63 may communicate that B1 is an available logical protocol interface 82. Thus, the discovery interfaces 90 may communicate and determine that the B1 logical protocol interface 82 is suitable and should be used by both the static region 60 and the partial reconfiguration region 62.

Figure 7:
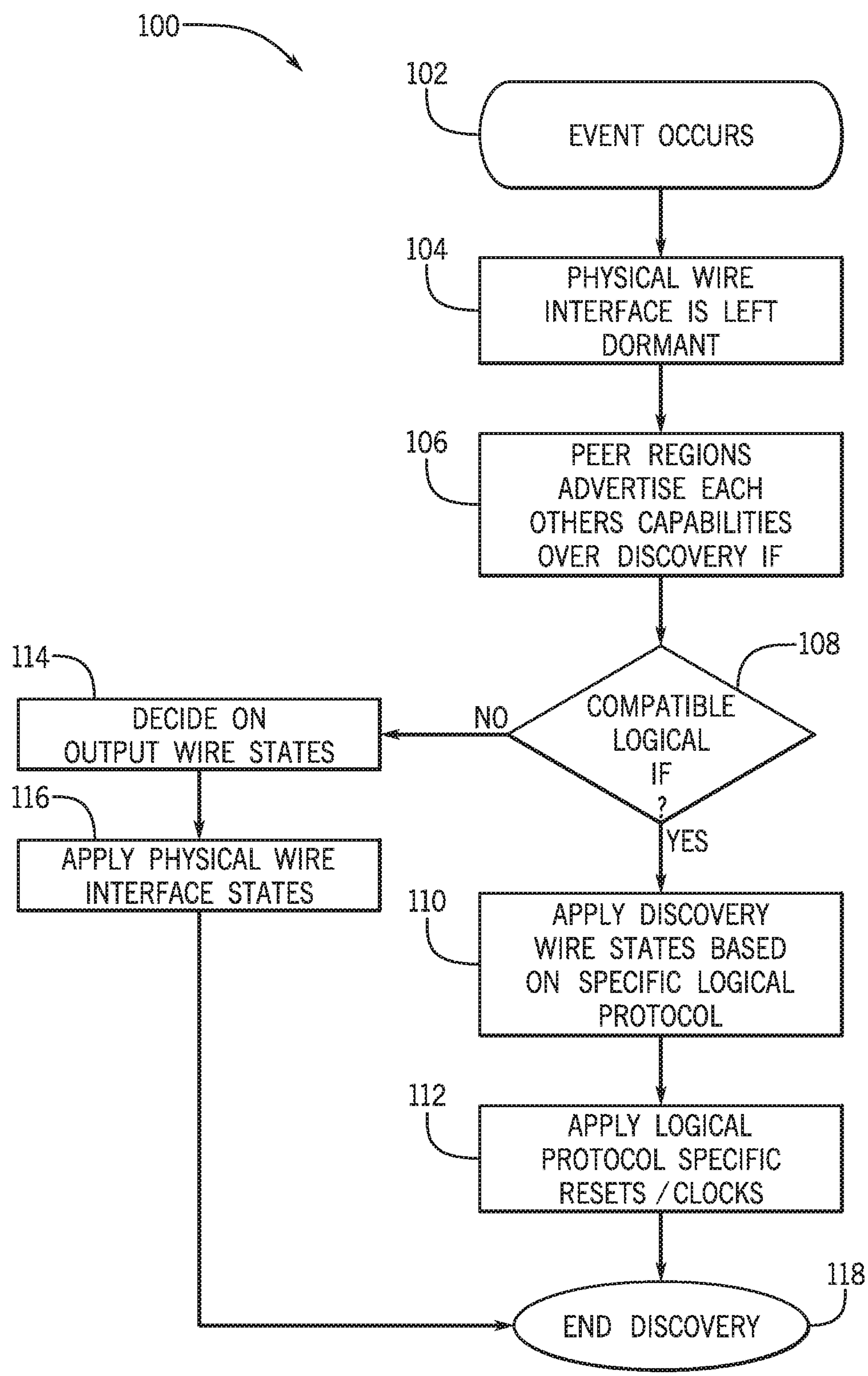
FIG. 7 is a flow chart illustrating a method that may be used in the integrated circuit device of FIG. 6 to perform logical interface discovery, in accordance with an embodiment.

With the foregoing in mind, FIG. 7 illustrates a flow chart of a method 100 for logical interface discovery, in accordance with embodiments described herein. Although the following description of the method 100 is described in a particular order, which represents a particular embodiment, it should be noted that the method 100 may be performed in any suitable order, and steps may be added or omitted.

The method 100 for logical interface discovery may begin after an event occurs, as block 102 describes. In some cases, for example, partial reconfiguration of the partial reconfiguration region 62 may trigger logical interface discovery. A number of other suitable events, such as a reset of the FPGA 40, a request to change the power and/or performance of the FPGA 40 and/or one of its regions, or an unsolicited rediscovery request by the static region 60 and/or the partial reconfiguration region 62 may additionally or alternatively trigger logical interface discovery. After any of the suitable events that trigger logical interface discovery occurs, the physical wire interface 70 may be left dormant (i.e., unallocated), as block 104 describes. That is, each of the wires of the physical wire interface 70 may be held low while the logical protocol interface 82 is determined. Thus, before the logical protocol interface 82 is determined, information may not be communicated via the physical wire interface 70. In some embodiments, while the physical wire interface 70 is held dormant, peer regions (i.e., regions engaged in logical interface discovery with each other) of the FPGA 40 may advertise their capabilities via their respective discovery interfaces 90, as block 106 describes. The capabilities of each region may include their supported logical protocol interfaces 82, which, as discussed, may include specific wire to port mapping options, port width options, clock speeds, and/or the like. The discovery interface 90 of each region may then determine, via its discovery logic block 91, whether its logical protocol interface 82 is compatible with the logical protocol interface 82 supported by a peer region, as described by block 108. That is, the discovery interface 90 of a region may determine whether any of its available logical protocol interfaces 82 match any one of the logical protocol interfaces 82 supported by a peer region. If the discovery interface 90 determines compatibility between the logical protocol interface 82 of the region and the peer region, a state based on the compatible logical protocol interface 82 may be applied to the discovery interface wires 92, as block 110 describes. Accordingly, in some embodiments, the discovery interface 90 may include a set of wire states specific to each logical protocol interface 82 that it supports. For example, the discovery interface 90 may include a first wire state for Avalon-MM, a second wire state for Avalon-ST, and a third wire state for AXI, to name a few. With the discovery interface wires 92 set to a certain state, the resets and clocks, for example, specific to the selected logical protocol may be applied by the region logic (i.e., static region logic 72 and/or partial reconfiguration region logic 74), as block 112 describes. Then, the logical interface discovery may end and the transmission of information via the physical wire interface 70, according to the selected logical protocol interface 82, may begin, as block 118 describes.

However, if the discovery interface 90 determines incompatibility between the logical protocol interface 82 of its region and its peer region, a safe state may be determined by the discovery interface wires 92, as block 114 describes. That is, instead of determining a state corresponding to a specific logical protocol interface 82, the peer regions may use their discovery interfaces 90 to negotiate a safe state to apply to the discovery interface wires 92 and the physical wire interface 70. The safe state may be chosen to keep the physical wire interface 70 stable since valid information may not be sent across the physical wire interface 70 when there is not a compatible logical protocol interface 82. After the safe state is determined, the safe state may be applied to the discovery interface wires 92 and the physical wire interface 70, as block 116 describes. At this point, the logical interface discovery may end until another event triggering logical interface discovery occurs, as block 118 describes.

Figure 8:
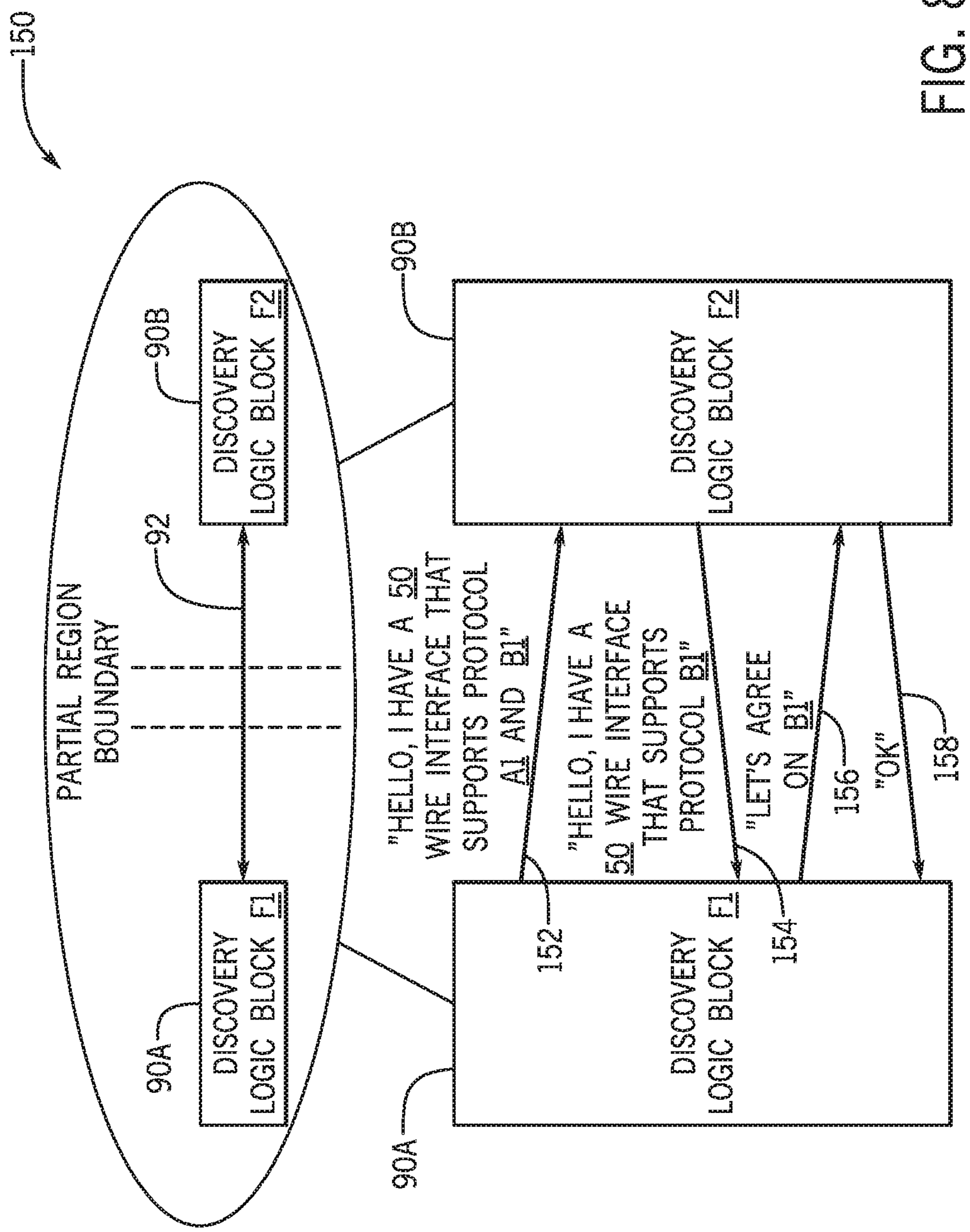
FIG. 8 is a block diagram of a protocol that may be used in the discovery interface of FIG. 6 to perform logical interface discovery, in accordance with an embodiment.

Turning now to FIG. 8, an embodiment of a discovery interface pseudo-protocol 150, which may be followed by the discovery logic blocks 91 as they communicate to one another during the method 100 for logical interface discovery, is illustrated. In such an embodiment, a first discovery logic block 91A may communicate to a second discovery logic block 91B across a partial reconfiguration region boundary (i.e., a boundary between a partial reconfiguration region 62 and another region) via the discovery interface wires 92. To broadcast their capabilities and determine a suitable logical protocol interface 82, if there are any, the first discovery logic block 91A and the second discovery logic block 91B may send messages (i.e., 152-158) to each other. For example, in the illustrated embodiment, the first discovery logic block 91A broadcasts that it supports A1 and B1 as its logical protocol interface 82 and that its physical wire interface supports 50 wires to the second discovery logic block 91B, as message 152 describes. The second discovery logic block 91B responds to the first discovery logic block 91A that it only supports B1 as its logical protocol interface 82 and that its physical wire interface supports 50 wires, as message 154 describes. As such, the first discovery logic block 91A determines that the discovery interfaces 90 have compatible physical wire interfaces 70 and that both discovery interfaces 90 support B1 as a logical protocol interface. Thus, the first discovery logic block 91A relays to the second discovery logic block 91B that B1 will be used as the logical protocol interface 82, as message 156 describes. The second discovery logic block 91B then confirms the logical protocol interface 82 that will be used, as message 158 describes, and the regions containing the first discovery logic block 91A and the second discovery logic block 91B may then prepare themselves to use the agreed upon logical protocol interface 82 (i.e., B1) and to transmit and/or receive data over the physical wire interface 70.

While the messages illustrated in FIG. 8 may demonstrate the discovery interfaces 90 using a handshake protocol to communicate to one another, it should be appreciated that any suitable protocol may be implemented between discovery interfaces 90. In some embodiments, regardless of the protocol implemented between discovery interfaces 90, the protocol of the discovery interface 90 may be known by each suitable region of the FPGA 40. As such, suitable communication between discovery interfaces 90 may be facilitated. Further, while the illustrated embodiment may demonstrate the negotiation of logical protocol interfaces 82 and the discussion of physical wire interfaces 70, it should be appreciated that the discovery interfaces 90 may additionally or alternatively negotiate other suitable parameters (e.g., specific wire to port mappings, port widths, clock speeds, and the like).

As discussed earlier, one of the events that may trigger logical interface discovery, as block 102 describes, may be partial reconfiguration of the partial reconfiguration region 62. Accordingly, FIG. 9 may illustrate the partial reconfiguration of the partial reconfiguration region 62 of the FPGA 40 illustrated in FIG. 6. During the partial reconfiguration process, the static region logic 72 may remain unchanged. As such, the static region logic 72 and the logical protocol interfaces 82 that it may support, illustrated in FIG. 9, may match those illustrated in FIG. 6. The partial reconfiguration region 62, on the other hand, may undergo changes during the partial reconfiguration process. As such, the logical protocol interfaces 82 supported by the partial reconfiguration region logic 74 may not be realized until the completion of the partial reconfiguration process.

Figure 9:
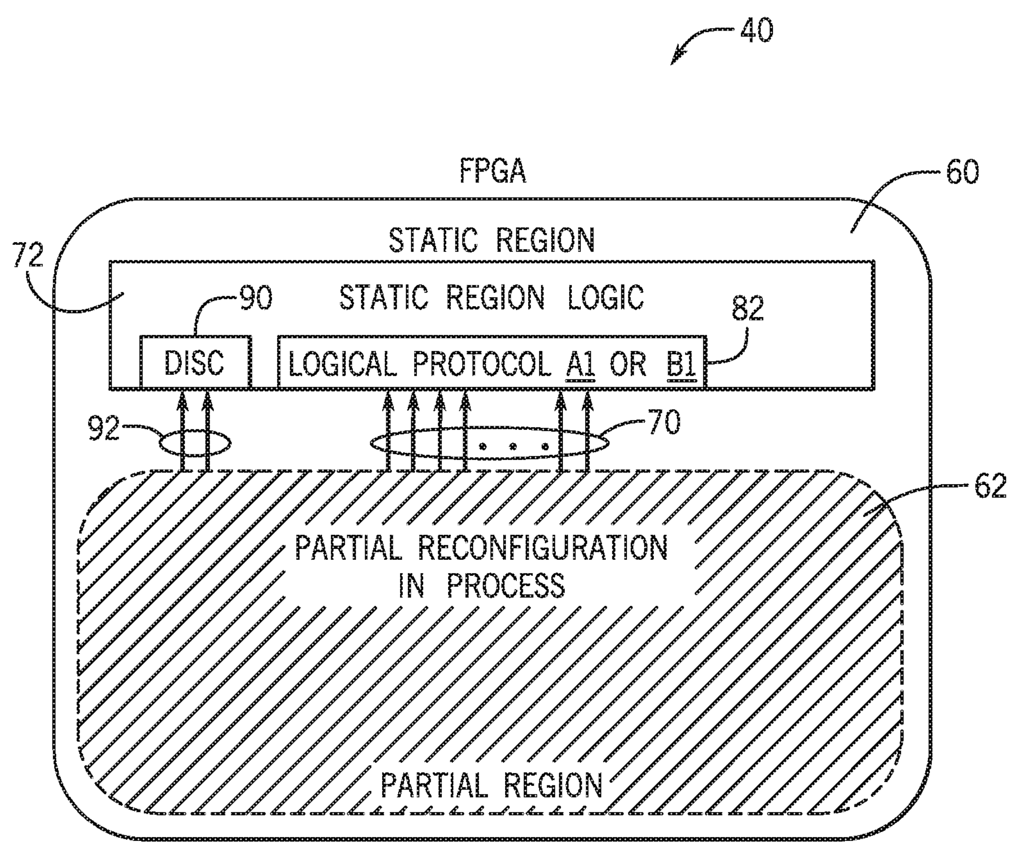
FIG. 9 is a block diagram of the integrated circuit of FIG. 6, in which the partial reconfiguration region is undergoing partial reconfiguration, in accordance with an embodiment.
Figure 10:
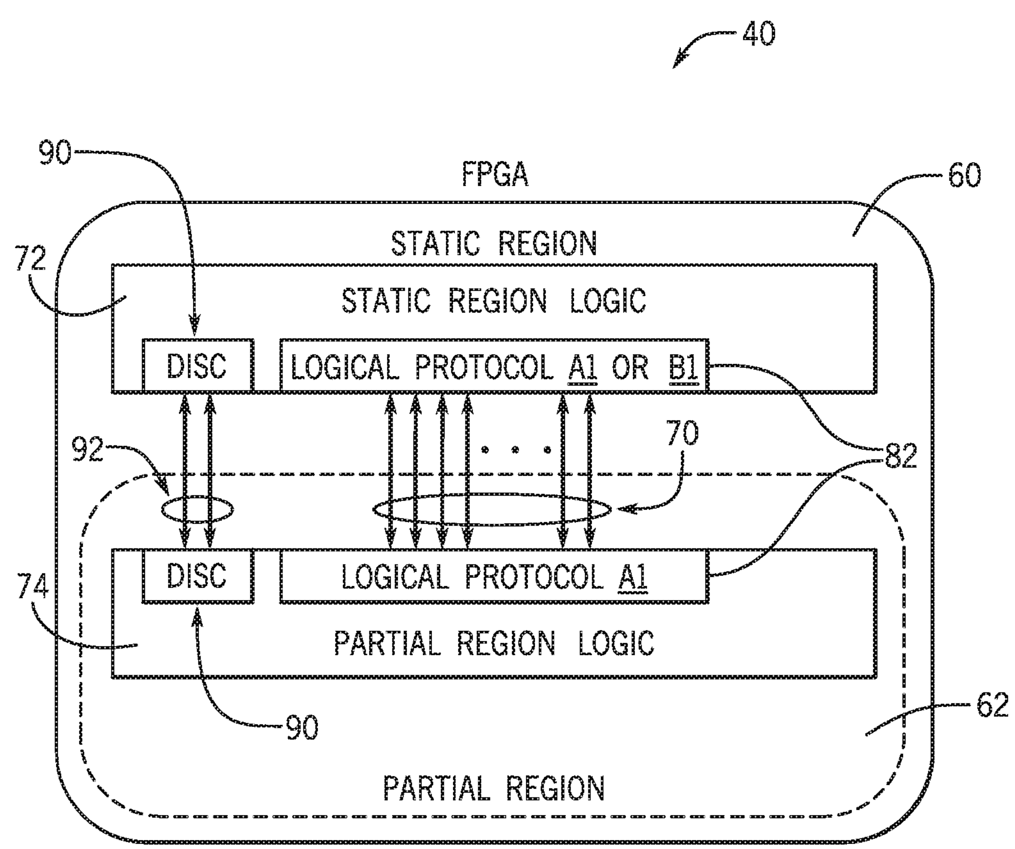
FIG. 10 is a block diagram of the integrated circuit of FIG. 6, in which the partial reconfiguration region supports a different logical protocol interface, in accordance with an embodiment.

At the completion of the partial reconfiguration illustrated in FIG. 9, the partial reconfiguration region 62 may support a different logical protocol interface 82 (i.e., A1), as illustrated in FIG. 10. As such, through logical interface discovery that may be triggered by the partial reconfiguration of the partial reconfiguration region 62, the discovery interfaces 90 may negotiate the use of logical protocol interface 82 A1, which both of the illustrated regions support. Thus, the static region 60 of FIG. 6 may update from implementing B1 as a logical protocol interface 82 to A1, after the partial reconfiguration region 62 is reconfigured. Further, as described, once the logical protocol interface 82 is agreed upon and initiated by both regions (e.g., the static region 60 and the partial reconfiguration region 62), the regions may begin transmitting and/or receiving data via the physical wire interface 70, according to the logical protocol interface 82.

Figure 11:
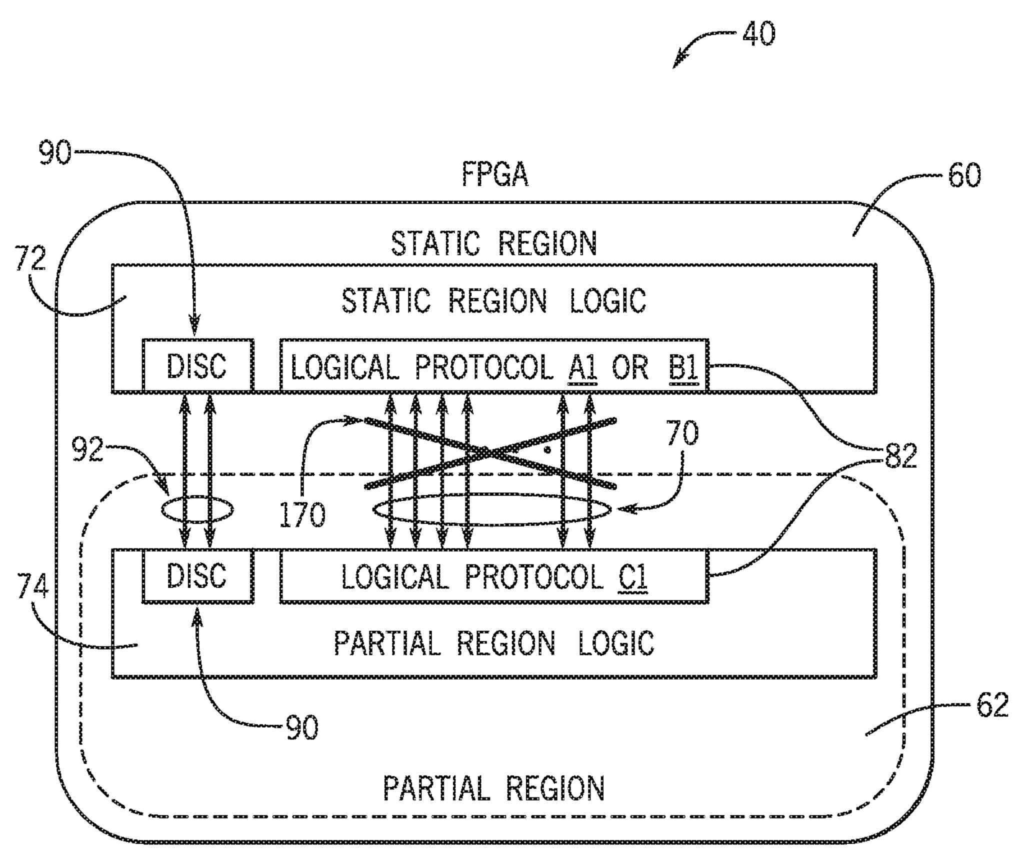
FIG. 11 is a block diagram of the integrated circuit of FIG. 6, in which the logical protocol interface of the partial reconfiguration region is incompatible with the logical protocol interface of the static region, in accordance with an embodiment.

If, however, the partial reconfiguration of the partial reconfiguration region 62 or a new partial reconfiguration region 62 introduced to the FPGA 40 does not support a logical protocol interface 82 supported by another region (e.g., the static region 60) on the FPGA, the physical wire interface 70 may not be used to transmit and/or receive data. Accordingly, FIG. 11 illustrates the discovery of incompatible logical protocol interfaces 82 between a static region 60 and a partial reconfiguration region 62. In such embodiments, because the partial reconfiguration region 62 does not support any of the logical protocol interfaces 82 supported by the static region 60, the physical wire interface 70 may be held in a safe state 170. The safe state 170 may prevent data from being transmitted and/or received via the physical wire interface 70, as the lack of a suitable matching logical protocol interface 82 between the static region 60 and the partial reconfiguration region 62 may corrupt data sent and/or received. As such, the safe state 170 may hold the physical wire interface 70 in a stable state until a new event triggers logical interface discovery and/or until a suitable logical protocol interface 82 is determined.

Figure 12:
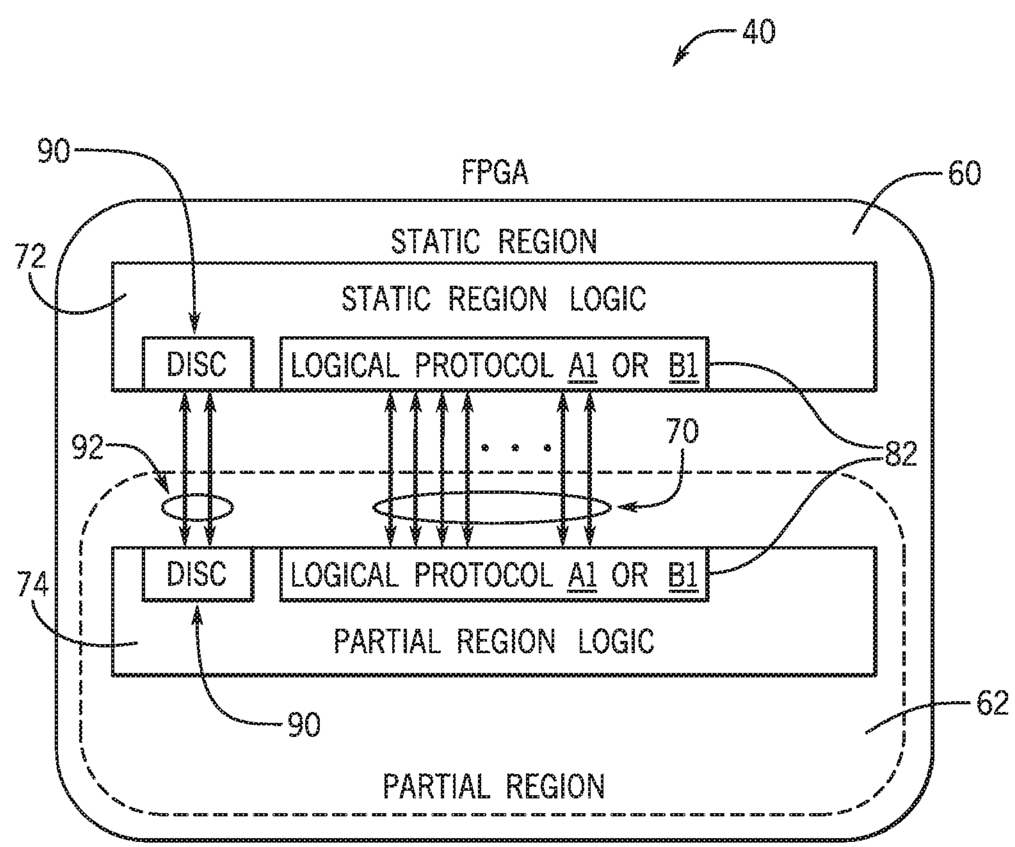
FIG. 12 is a block diagram of the integrated circuit of FIG. 6, in which the static region and the partial reconfiguration region include multiple compatible logical protocol interfaces, in accordance with an embodiment.

In some embodiments, peer regions on an FPGA 40 may each support multiple logical protocol interfaces 82 that are compatible, as illustrated in FIG. 12. For example, in the illustrated embodiment, both the static region 60 and the partial reconfiguration region 62 support both A1 and B1 as logical protocol interfaces 82. In such embodiments, the discovery interfaces 90 may determine that both A1 and B1 are suitable logical protocol interfaces 82 to use, as both the static region 60 and the partial reconfiguration region 62 support them both. However, in some embodiments, because only a single logical protocol interface 82 may be used at a time, the discovery interfaces 90 may select the most suitable logical protocol interface 82 to use. The most suitable logical protocol interface 82 may be determined based on a suitable combination of the resulting power, efficiency, performance, or the like. For example, in some embodiments, A1 may be the selected, more suitable protocol if it uses less power and has improved efficiency at the cost of decreased performance when compared to B1. While in other cases, B1, a higher-power, less efficient logical protocol interface 82 may be selected based on improved performance and/or a different set of needs in the FPGA 40.

Figure 13:
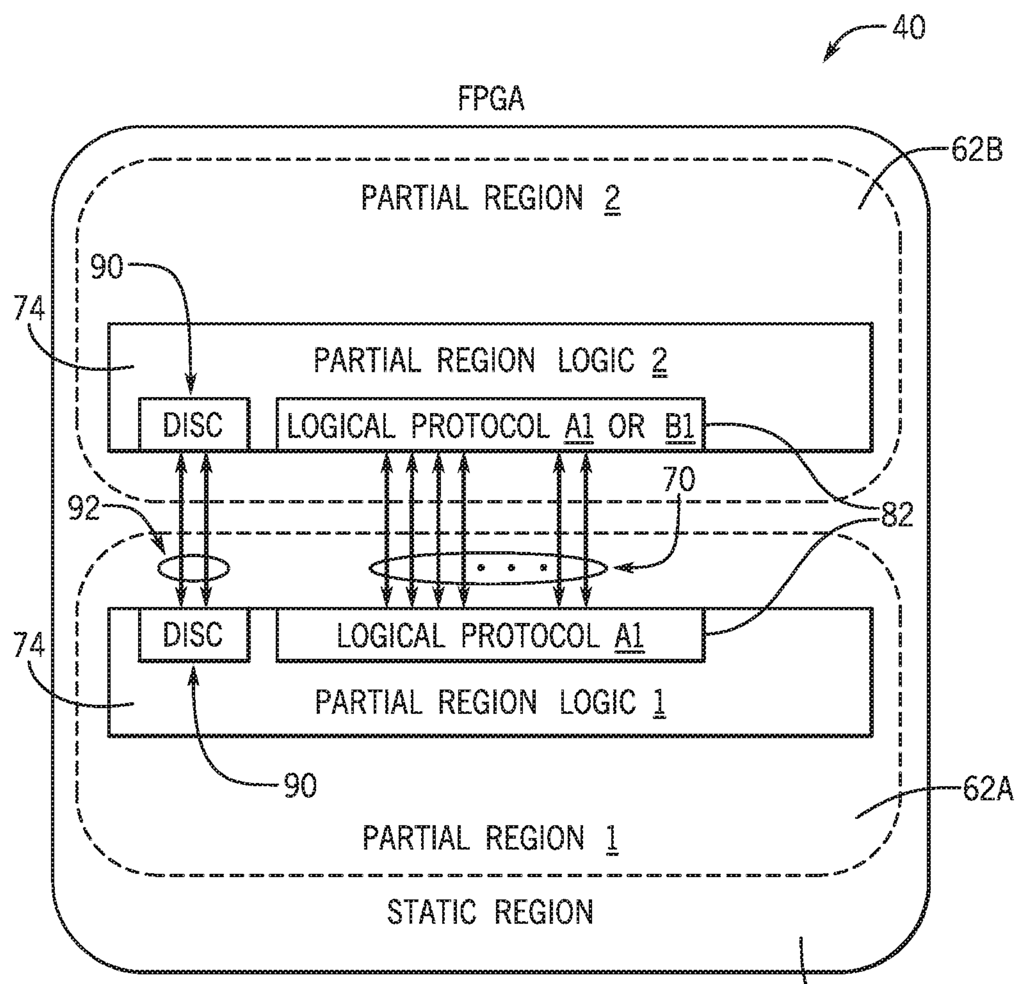
FIG. 13 is a block diagram of an integrated circuit with a partial reconfiguration region communicatively coupled to an additional partial reconfiguration region via a physical wire interface and a logical protocol interface, in accordance with an embodiment.

Further, in some embodiments, instead of or in addition to using a partial reconfiguration region 62 and a static region 60 as peer regions connected via the physical wire interface 70, the FPGA 40 may contain a set of partial reconfiguration regions 62 that are peer regions, as illustrated in FIG. 13. As such, a first partial reconfiguration region 62A may communicate with a second partial reconfiguration region 62B instead of or in addition to a static region 60. In such embodiments, the discovery interfaces 90 of the first partial reconfiguration region 62A and the second partial reconfiguration region 62B may perform the same functions as the discovery interfaces 90 of a partial reconfiguration region 62 and a peer static region 60. However, both the first partial reconfiguration region 62A and the second partial reconfiguration region 62B are capable of being partially reconfigured individually or simultaneously. Thus, the logical interface discovery may be triggered by the partial reconfiguration of either and/or both of the first partial reconfiguration region 62A or the second partial reconfiguration region 62B.

Figure 14:
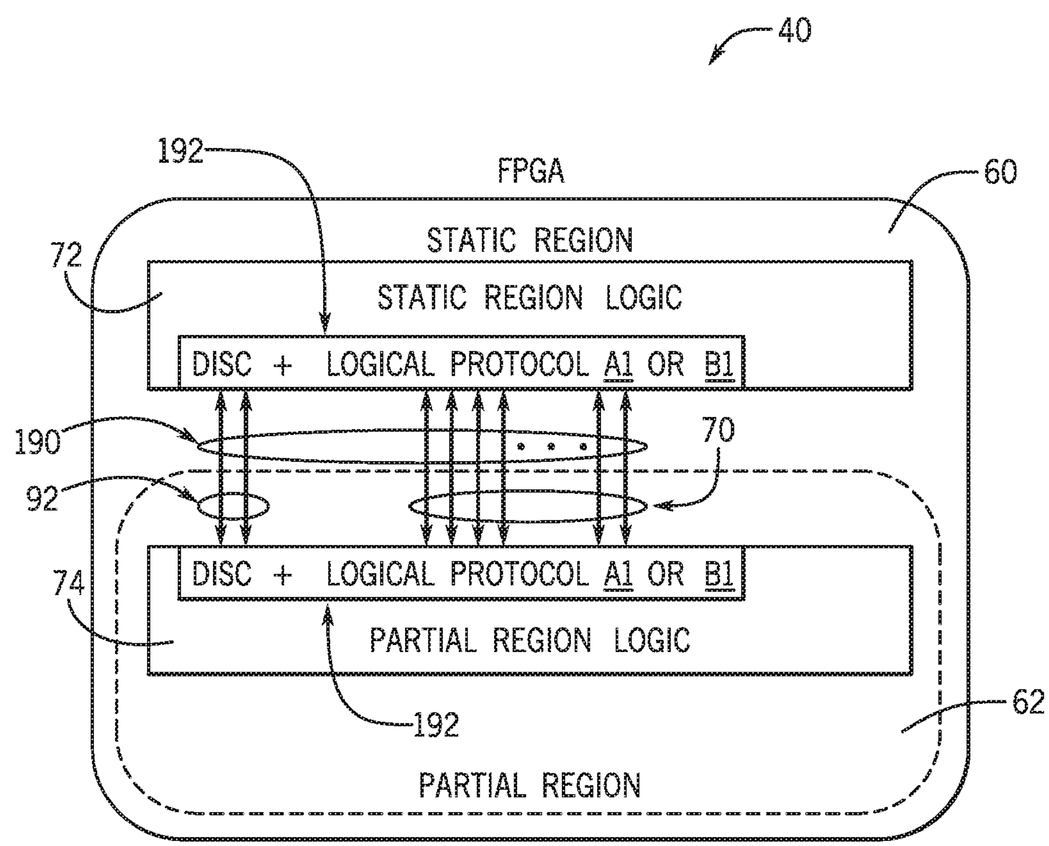
FIG. 14 is a block diagram of the integrated circuit of FIG. 6, in which the discovery interface, the logical protocol interface, and the physical wire interface are included in an additional interface, in accordance with an embodiment.

Turning now to FIG. 14, while the foregoing descriptions and illustrations demonstrate discovery interface wires 92 separate, or out of band, from the physical wire interface 70, in some embodiments, the discovery interface wires 92 may be in band with the physical wire interface 70. That is, a set of wires 190 may combine the physical wire interface 70 and the discovery interface wires 92 into a single set. As such, the static region logic 72 and/or the partial reconfiguration region logic 74 may contain an interface 192 containing the logic and structure for the discovery interface 90, the logical protocol interface 82, and the physical wire interface 70. Accordingly, the interface 192 may contain a subset of wires for the discovery interface 90 dedicated to a constant function (e.g., logical interface discovery) and an additional subset of wires that may be used as the physical wire interface 70. In another embodiment, some or all of the wires included in the interface 192 may first implement logical interface discovery via a protocol of the discovery interface 90 included in the interface 192, and at the completion of the logical interface discovery, the function of some or all of the wires may transition to be suitable for the physical wire interface 70 included in the interface 192.

Figure 15:
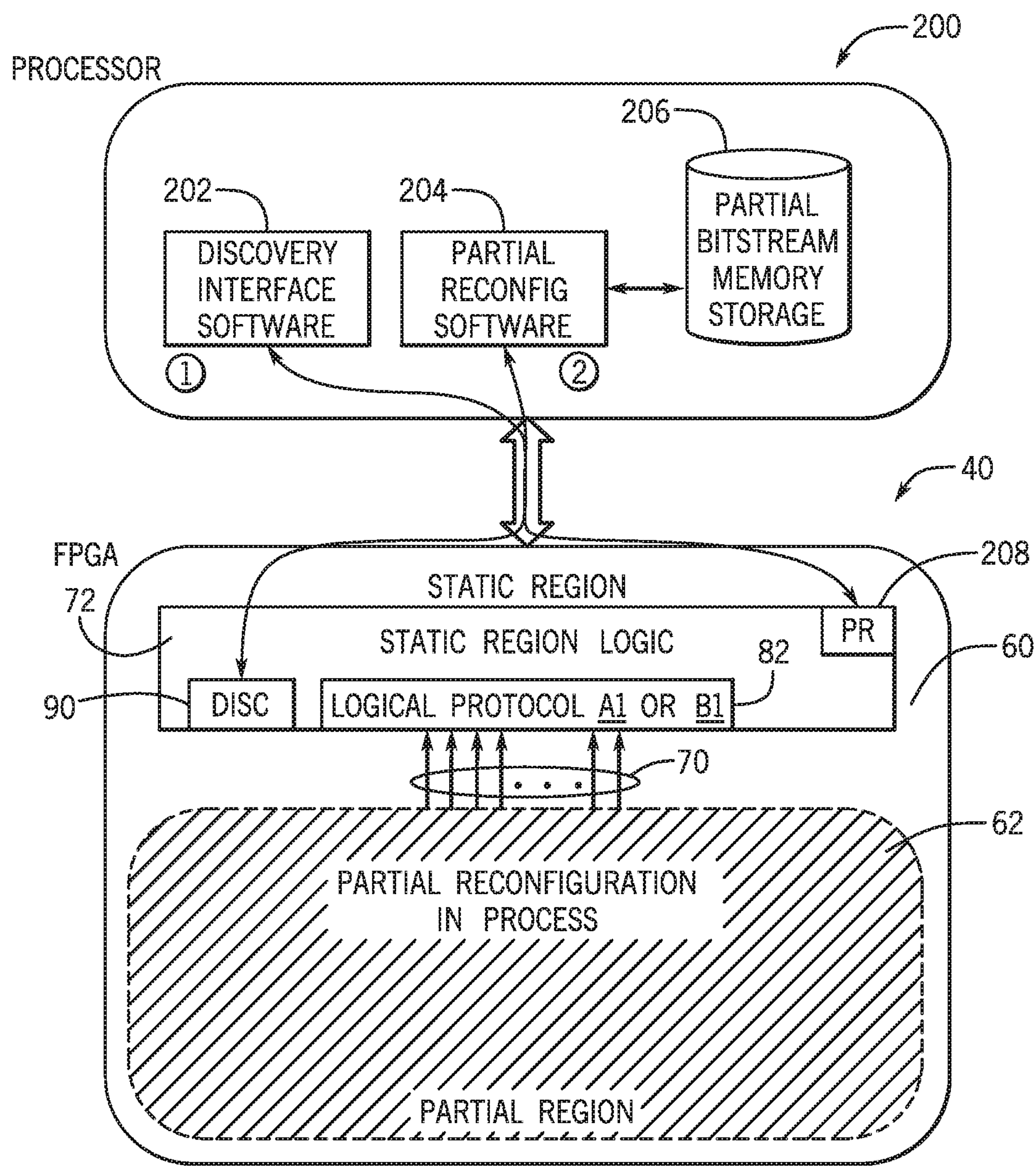
FIG. 15 is a block diagram of an integrated circuit communicatively coupled to a processor to enable partial reconfiguration of a partial reconfiguration region with a logical protocol interface based on an additional logical protocol interface included in a static region, in accordance with an embodiment.

As FIG. 15 illustrates, in some embodiments, the partial reconfiguration region 62 may lack a discovery interface 90. As such, the logical interface discovery may be handled by the static region 60, and the discovery interface 90 contained within the static region logic 72 may lack discovery interface wires 92, as connection to another discovery interface 90 may not be available and/or desirable. In such embodiments, the static region 60 may communicate with a processor 200 via the static region logic 72. During partial reconfiguration of the partial reconfiguration region 62 and/or after any event triggering logical interface discovery occurs, the discovery interface 90 of the static region 60 may communicate capabilities, including the logical protocol interfaces 82, supported by the static region logic 72 to the processor 200. The processor 200 may contain discovery interface software 202 that may interpret the supported capabilities. Additionally, or in the alternative, the processor 200 may have existing knowledge of the static region logic's 72 capabilities based on the configuration of the static region 60. That is, the processor 200 may determine the capabilities of the static region logic 72 based on a bitstream used to configure the static region 60, metadata informing the static region logic 72 of its protocols, and/or the like. With knowledge of the static region logic's 72 capabilities, the processor 200 may communicate to partial reconfiguration software 204 a logical protocol interface 82 for the partial reconfiguration region 62 that may be compatible with the existing logical protocol interface 82 in the static region 60. As such, the partial reconfiguration software 204 may request a suitable bitstream from a partial bitstream memory storage 206 that may be used to configure the partial reconfiguration region 62 with the compatible logical protocol interface 82. The processor 200 may communicate the bitstream from the partial reconfiguration software 204 to a partial reconfiguration block 208 within the static region 60 so that the partial reconfiguration of the partial reconfiguration region 62 may occur based at least in part on the bitstream. As such, the partial reconfiguration block 208 may influence the partial reconfiguration of the partial reconfiguration region 62 so that the resulting partial reconfiguration region 62 is compatible with the static region 60, in terms of physical wire interfaces 70, logical protocol interfaces 82, and the like.

Further, any suitable combination of embodiments described herein may be implemented in a data center. That is, a data center may include, for example, an FPGA 40 that includes a static region 60, a partial region 62, and a discovery interface 90. Further, in some embodiments, the data center may include a processor 200 coupled to a static region 60 and configured to control the partial reconfiguration of a partial region 62.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

Embodiments of the Current Application

The following numbered clauses define embodiments of the current application.

Clause A1. An integrated circuit device, comprising:

a first configurable logic region configured to communicate using any of a first set of logical protocol interfaces; and a second configurable logic region communicatively coupled to the first configurable logic region via a physical wire interface, wherein the second configurable logic region is configured to communicate using any of a second set of logical protocol interfaces;

wherein the first configurable logic region, the second configurable logic region, or a combination thereof, comprises a discovery interface configured to determine a compatible logical protocol interface shared by both the first set of logical protocol interfaces and the second set of logical protocol interfaces.

Clause A2. The integrated circuit device of clause A1, wherein the discovery interface comprises a set of wires communicatively coupling the first configurable logic region to the second configurable logic region.

Clause A3. The integrated circuit device of clause A2, wherein the set of wires of the discovery interface are out of band with respect to the physical wire interface.

Clause A4. The integrated circuit device of clause A1 or 2, wherein the compatible logical protocol interface and an additional compatible logical protocol interface are shared by both the first set of logical protocol interfaces and the second set of logical protocol interfaces.

Clause A5. The integrated circuit device of clause A4, wherein the discovery interface is configured to select the compatible logical protocol interface for the first configurable logic region to implement.

Clause A6. The integrated circuit device of clause A5, wherein the discovery interface is configured to select the compatible logical protocol interface based at least in part on power characteristics, performance characteristics, efficiency characteristics, or a combination thereof, of the compatible logical protocol interface when implemented by the first configurable logic region.

Clause A7. The integrated circuit device of clause A1, 2, or 4, wherein the first configurable logic region is partially reconfigurable.

Clause A8. The integrated circuit device of clause A1, 2, 4, or 7, wherein the discovery interface is configured to use a communication protocol implemented by the first configurable logic region.

Clause A9. The integrated circuit device of clause A1, 2, 4, 7, or 8, wherein a logical protocol interface in the first set of logical protocol interfaces comprises Avalon Memory Mapped Interface (Avalon-MM), Avalon Streaming Interface (Avalon-ST), Advanced Extensible Interface (AXI), or Core Cache Interface (CCI-P).

Clause A10. The integrated circuit device of clause A1, 2, 4, 7, 8, or 9, wherein the integrated circuit device comprises a field programmable gate array (FPGA).

Clause A11. A method for discovering a compatible logical protocol interface shared between a first logic region and a second logic region on an integrated circuit device, wherein the compatible logical protocol comprises a first logical protocol interface capability, comprising:

advertising the first logical protocol interface capability to first discovery interface circuitry, wherein the first logic region is configured to implement the first logical protocol interface capability;

advertising a second logical protocol interface capability of the second logic region to second discovery interface circuitry;

determining, via the first discovery interface circuitry, the first logical protocol interface capability is compatible with the second logical protocol interface capability; and in response to determining the first logical protocol interface capability is compatible with the second logical protocol interface capability, applying a wire state to wires of the first discovery interface circuitry to enable communication via the compatible logical protocol interface.

Clause A12. The method of clause A11, wherein an event triggers initiation of the method, wherein the event comprises partial reconfiguration of the first logic region, partial reconfiguration of the second logic region, or a combination thereof.

Clause A13. The method of any one of the preceding clauses, wherein the first logical protocol interface capability comprises a protocol type, a set of clock speeds, a set of port widths, a set of port mappings, or a combination thereof.

Clause A14. The method of any one of the preceding clauses, comprising in response to determining the first logical protocol interface capability is compatible with the second logical protocol interface capability, applying resets, clocks, or a combination thereof to the first logic region based on the compatible logical protocol interface.

Clause A15. The method of any one of the preceding clauses, comprising holding a physical wire interface in an unallocated state until determining the first logical protocol interface capability is compatible with the second logical protocol interface capability, wherein the physical wire interface is configured to communicatively couple the first logic region to the second logic region.

Clause A16. The method of clause A15, comprising in response to determining the first logical protocol interface capability is not compatible with the second logical protocol interface capability, applying a safe state to the physical wire interface.

Clause A17. An integrated circuit device, comprising:

a first configurable logic region, comprising a logical protocol interface;

a second configurable logic region communicatively coupled to the first configurable logic region via a physical wire interface, wherein the second configurable logic region is partially reconfigurable; and a processor communicatively coupled to the first configurable logic region, wherein the processor is configured to control partial reconfiguration of the second configurable logic region based in part on the logical protocol interface.

Clause A18. The integrated circuit device of clause A17, wherein a discovery interface is configured to communicate the logical protocol interface to the processor.

Clause A19. The integrated circuit device of any one of the preceding clauses, wherein the processor is configured to determine the logical protocol interface based on a bitstream used to configure the first configurable logic region.

Clause A20. The integrated circuit device of any one of the preceding clauses, wherein the processor is configured to control partial reconfiguration of the second configurable logic region by selecting a partial bitstream that results in the logical protocol interface.

Clause B1. An integrated circuit device, comprising:

a first configurable logic region configured to communicate using any of a first set of logical protocol interfaces; and a second configurable logic region communicatively coupled to the first configurable logic region via a physical wire interface, wherein the second configurable logic region is configured to communicate using any of a second set of logical protocol interfaces;

wherein the first configurable logic region, the second configurable logic region, or a combination thereof, comprises a discovery interface configured to determine a compatible logical protocol interface shared by both the first set of logical protocol interfaces and the second set of logical protocol interfaces.

Clause B2. The integrated circuit device of clause B1, wherein the discovery interface comprises a set of wires communicatively coupling the first configurable logic region to the second configurable logic region.

Clause B3. The integrated circuit device of clause B2, wherein the set of wires of the discovery interface are out of band with respect to the physical wire interface.

Clause B4. The integrated circuit device of clause B1 or 2, wherein the compatible logical protocol interface and an additional compatible logical protocol interface are shared by both the first set of logical protocol interfaces and the second set of logical protocol interfaces.

Clause B5. The integrated circuit device of clause B4, wherein the discovery interface is configured to select the compatible logical protocol interface for the first configurable logic region to implement.

Clause B6. The integrated circuit device of clause B5, wherein the discovery interface is configured to select the compatible logical protocol interface based at least in part on power characteristics, performance characteristics, efficiency characteristics, or a combination thereof, of the compatible logical protocol interface when implemented by the first configurable logic region.

Clause B7. The integrated circuit device of clause B1, 2, or 4, wherein the first configurable logic region is partially reconfigurable.

Clause B8. The integrated circuit device of clause B1, 2, 4, or 7, wherein the discovery interface is configured to use a communication protocol implemented by the first configurable logic region.

Clause B9. The integrated circuit device of clause B1, 2, 4, 7, or 8, wherein a logical protocol interface in the first set of logical protocol interfaces comprises Avalon Memory Mapped Interface (Avalon-MM), Avalon Streaming Interface (Avalon-ST), Advanced Extensible Interface (AXI), or Core Cache Interface (CCI-P).

Clause B10. The integrated circuit device of clause B1, 2, 4, 7, 8, or 9, wherein the integrated circuit device comprises a field programmable gate array (FPGA).

Clause B11. A method for discovering a compatible logical protocol interface shared between a first logic region and a second logic region on an integrated circuit device, wherein the compatible logical protocol comprises a first logical protocol interface capability, comprising:

advertising the first logical protocol interface capability to first discovery interface circuitry, wherein the first logic region is configured to implement the first logical protocol interface capability;

advertising a second logical protocol interface capability of the second logic region to second discovery interface circuitry;

determining, via the first discovery interface circuitry, the first logical protocol interface capability is compatible with the second logical protocol interface capability; and in response to determining the first logical protocol interface capability is compatible with the second logical protocol interface capability, applying a wire state to wires of the first discovery interface circuitry to enable communication via the compatible logical protocol interface.

Clause B12. The method of clause B11, wherein an event triggers initiation of the method, wherein the event comprises partial reconfiguration of the first logic region, partial reconfiguration of the second logic region, or a combination thereof.

Clause B13. The method of any one of the preceding clauses, wherein the first logical protocol interface capability comprises a protocol type, a set of clock speeds, a set of port widths, a set of port mappings, or a combination thereof.

Clause B14. The method of any one of the preceding clauses, comprising in response to determining the first logical protocol interface capability is compatible with the second logical protocol interface capability, applying resets, clocks, or a combination thereof to the first logic region based on the compatible logical protocol interface.

Clause B15. The method of any one of the preceding clauses, comprising holding a physical wire interface in an unallocated state until determining the first logical protocol interface capability is compatible with the second logical protocol interface capability, wherein the physical wire interface is configured to communicatively couple the first logic region to the second logic region.

Clause B16. The method of clause B15, comprising in response to determining the first logical protocol interface capability is not compatible with the second logical protocol interface capability, applying a safe state to the physical wire interface.

Clause B17. An integrated circuit device, comprising:

- a first configurable logic region, comprising a logical protocol interface;
- a second configurable logic region communicatively coupled to the first configurable logic region via a physical wire interface, wherein the second configurable logic region is partially reconfigurable; and
- a processor communicatively coupled to the first configurable logic region, wherein the processor is configured to control partial reconfiguration of the second configurable logic region based in part on the logical protocol interface.

Clause B18. The integrated circuit device of clause B17, wherein a discovery interface is configured to communicate the logical protocol interface to the processor.

Clause B19. The integrated circuit device of any one of the preceding clauses, wherein the processor is configured to determine the logical protocol interface based on a bitstream used to configure the first configurable logic region.

Clause B20. The integrated circuit device of any one of the preceding clauses, wherein the processor is configured to control partial reconfiguration of the second configurable logic region by selecting a partial bitstream that results in the logical protocol interface.

Clause B21. A system, comprising:

- an integrated circuit device, comprising:
  - a first configurable logic region, comprising a logical protocol interface; and
  - a second configurable logic region communicatively coupled to the first configurable logic region via a physical wire interface, wherein the second configurable logic region is partially reconfigurable; and
- a processor communicatively coupled to the integrated circuit device, wherein the processor is configured to control partial reconfiguration of the second configurable logic region based in part on the logical protocol interface.

Clause B22. The system of clause B21, wherein a discovery interface is configured to communicate the logical protocol interface to the processor.

Clause C1. An integrated circuit device, comprising:

a first configurable logic region configured to communicate using any of a first set of logical protocol interfaces; and a second configurable logic region communicatively coupled to the first configurable logic region via a physical wire interface, wherein the second configurable logic region is configured to communicate using any of a second set of logical protocol interfaces;

wherein the first configurable logic region, the second configurable logic region, or a combination thereof, comprises a discovery interface configured to determine a compatible logical protocol interface shared by both the first set of logical protocol interfaces and the second set of logical protocol interfaces.

Clause C2. The integrated circuit device of clause C1, wherein the discovery interface comprises a set of wires communicatively coupling the first configurable logic region to the second configurable logic region.

Clause C3. The integrated circuit device of clause C1 or 2, wherein the compatible logical protocol interface and an additional compatible logical protocol interface are shared by both the first set of logical protocol interfaces and the second set of logical protocol interfaces.

Clause C4. The integrated circuit device of clause C3, wherein the discovery interface is configured to select the compatible logical protocol interface for the first configurable logic region to implement.

Clause C5. The integrated circuit device of clause C4, wherein the discovery interface is configured to select the compatible logical protocol interface based at least in part on power characteristics, performance characteristics, efficiency characteristics, or a combination thereof, of the compatible logical protocol interface when implemented by the first configurable logic region.

Clause C6. The integrated circuit device of clause C1, 2, or 3, wherein the first configurable logic region is partially reconfigurable.

Clause C7. The integrated circuit device of clause C1, 2, 3, or 6, wherein the integrated circuit device comprises a field programmable gate array (FPGA).

Clause C8. A method for discovering a compatible logical protocol interface shared between a first logic region and a second logic region on an integrated circuit device, wherein the compatible logical protocol comprises a first logical protocol interface capability, comprising:

advertising the first logical protocol interface capability to first discovery interface circuitry, wherein the first logic region is configured to implement the first logical protocol interface capability;

advertising a second logical protocol interface capability of the second logic region to second discovery interface circuitry;

determining, via the first discovery interface circuitry, the first logical protocol interface capability is compatible with the second logical protocol interface capability; and in response to determining the first logical protocol interface capability is compatible with the second logical protocol interface capability, applying a wire state to wires of the first discovery interface circuitry to enable communication via the compatible logical protocol interface.

Clause C9. The method of clause C8, wherein an event triggers initiation of the method, wherein the event comprises partial reconfiguration of the first logic region, partial reconfiguration of the second logic region, or a combination thereof.

Clause C10. The method of any of the preceding clauses, wherein the first logical protocol interface capability comprises a protocol type, a set of clock speeds, a set of port widths, a set of port mappings, or a combination thereof.

Clause C11. The method of any of the preceding clauses, comprising:

holding a physical wire interface in an unallocated state until determining the first logical protocol interface capability is compatible with the second logical protocol interface capability, wherein the physical wire interface is configured to communicatively couple the first logic region to the second logic region; and in response to determining the first logical protocol interface capability is not compatible with the second logical protocol interface capability, applying a safe state to the physical wire interface.

Clause C12. An integrated circuit device, comprising:

a first configurable logic region, comprising a logical protocol interface;

a second configurable logic region communicatively coupled to the first configurable logic region via a physical wire interface, wherein the second configurable logic region is partially reconfigurable; and a processor communicatively coupled to the first configurable logic region, wherein the processor is configured to control partial reconfiguration of the second configurable logic region based in part on the logical protocol interface.

Clause C13. The integrated circuit device of clause C12, wherein a discovery interface is configured to communicate the logical protocol interface to the processor.

Clause C14. The integrated circuit device of any of the preceding clauses, wherein the processor is configured to determine the logical protocol interface based on a bitstream used to configure the first configurable logic region.

Clause C15. The integrated circuit device of any of the preceding clauses, wherein the processor is configured to control partial reconfiguration of the second configurable logic region by selecting a partial bitstream that results in the logical protocol interface.

What is claimed is:

1. An integrated circuit device, comprising:

a first configurable logic region of the integrated circuit device configurable to communicate using any of a first set of logical protocol interfaces; and a second configurable logic region of the integrated circuit device communicatively coupled to the first configurable logic region via a physical wire interface, wherein the second configurable logic region is configurable to communicate using any of a second set of logical protocol interfaces;

wherein the first configurable logic region, the second configurable logic region, or a combination thereof, comprises a discovery interface configurable to:

communicate an indication of the first set of logical protocol interfaces, the second set of logical protocol interfaces, or a combination thereof, from the respective first configurable logic region, the second configurable logic region, or the combination thereof, wherein the first set of logical protocol interfaces, the second set of logical protocol interfaces, or the combination thereof, comprise data indicating a communication standard and a configuration of the physical wire interface; and select a compatible logical protocol interface shared by both the first set of logical protocol interfaces and the second set of logical protocol interfaces based on the communicated indication of the first set of logical protocol interfaces, the second set of logical protocol interfaces, or the combination thereof, wherein the first configurable logic region, the second configurable logic region, or a combination thereof, are partially reconfigurable based at least in part on the selected compatible logical protocol interface.

2. The integrated circuit device of claim 1, wherein the discovery interface comprises a set of wires communicatively coupling the first configurable logic region to the second configurable logic region.

3. The integrated circuit device of claim 2, wherein the set of wires of the discovery interface are out of band with respect to the physical wire interface.

4. The integrated circuit device of claim 1, wherein the compatible logical protocol interface and an additional compatible logical protocol interface are shared by both the first set of logical protocol interfaces and the second set of logical protocol interfaces.

5. The integrated circuit device of claim 4, wherein the discovery interface is configurable to select the compatible logical protocol interface for the first configurable logic region to implement.

6. The integrated circuit device of claim 5, wherein the discovery interface is configurable to select the compatible logical protocol interface based at least in part on power characteristics, performance characteristics, efficiency characteristics, or a combination thereof, of the compatible logical protocol interface when implemented by the first configurable logic region.

7. The integrated circuit device of claim 1, wherein the first configurable logic region is partially reconfigurable.

8. The integrated circuit device of claim 1, wherein the discovery interface is configurable to use a communication protocol implemented by the first configurable logic region.

9. The integrated circuit device of claim 1, wherein a logical protocol interface in the first set of logical protocol interfaces comprises Avalon Memory Mapped Interface (Avalon-MM), Avalon Streaming Interface (Avalon-ST), Advanced Extensible Interface (AXI), or Core Cache Interface (CCI-P).

10. The integrated circuit device of claim 1, wherein the integrated circuit device comprises a field programmable gate array (FPGA).

11. A method for discovering a compatible logical protocol interface shared between a first logic region and a second logic region on an integrated circuit device, wherein the compatible logical protocol interface comprises a first logical protocol interface capability, comprising:

advertising the first logical protocol interface capability to first discovery interface circuitry, wherein the first logic region is configured to implement the first logical protocol interface capability;

advertising a second logical protocol interface capability of the second logic region to second discovery interface circuitry;

determining, via the first discovery interface circuitry, the first logical protocol interface capability is compatible with the second logical protocol interface capability; and in response to determining the first logical protocol interface capability is compatible with the second logical protocol interface capability, applying a wire state to wires of the first discovery interface circuitry to enable communication via the compatible logical protocol interface.

12. The method of claim 11, wherein an event triggers initiation of the method, wherein the event comprises partial reconfiguration of the first logic region, partial reconfiguration of the second logic region, or a combination thereof.

13. The method of claim 11, wherein the first logical protocol interface capability comprises a protocol type, a set of clock speeds, a set of port widths, a set of port mappings, or a combination thereof.

14. The method of claim 11, comprising in response to determining the first logical protocol interface capability is compatible with the second logical protocol interface capability, applying resets, clocks, or a combination thereof to the first logic region based on the compatible logical protocol interface.

15. The method of claim 11, comprising holding a physical wire interface in an unallocated state until determining the first logical protocol interface capability is compatible with the second logical protocol interface capability, wherein the physical wire interface is configured to communicatively couple the first logic region to the second logic region.

16. The method of claim 15, comprising in response to determining the first logical protocol interface capability is not compatible with the second logical protocol interface capability, applying a safe state to the physical wire interface.

17. An integrated circuit device, comprising:

a first configurable logic region, comprising a logical protocol interface;

a second configurable logic region communicatively coupled to the first configurable logic region via a physical wire interface, wherein the second configurable logic region is partially reconfigurable; and a processor communicatively coupled to the first configurable logic region, wherein the processor is configured to control partial reconfiguration of the second configurable logic region based in part on the logical protocol interface.

18. The integrated circuit device of claim 17, wherein a discovery interface is configured to communicate the logical protocol interface to the processor.

19. The integrated circuit device of claim 17, wherein the processor is configured to determine the logical protocol interface based on a bitstream used to configure the first configurable logic region.

20. The integrated circuit device of claim 17, wherein the processor is configured to control partial reconfiguration of the second configurable logic region by selecting a partial bitstream that results in the logical protocol interface.

* * * * *